United States Patent [19]
Zitelli et al.

[11] 3,940,759
[45] Feb. 24, 1976

[54] ANALOG SIGNAL PROCESSING SYSTEM WITH CORRECTION FOR AMPLIFIER OFFSET

[75] Inventors: William E. Zitelli, Media; Andras I. Szabo, Export, both of Pa.

[73] Assignee: Westinghouse Electric Corporation, Pittsburgh, Pa.

[22] Filed: June 24, 1974

[21] Appl. No.: 482,194

[52] U.S. Cl. 340/347 AD; 340/347 CC; 179/15 BL; 330/9; 330/30 D; 330/116
[51] Int. Cl.² ........................................ H03K 13/02
[58] Field of Search............. 340/347 AD, 347 CC; 178/69 D, 88; 179/15 BL; 330/30 D, 69, 116, 9; 235/168

[56] References Cited
UNITED STATES PATENTS

| | | | |
|---|---|---|---|
| 2,972,137 | 2/1961 | Dunn | 235/154 UX |
| 3,089,097 | 5/1963 | Bell | 330/9 |
| 3,629,719 | 12/1971 | Heller et al. | 330/16 UX |

OTHER PUBLICATIONS
Analog Devices, Inc., "Analog–Digital Conversion Handbook," 6/1972, pp. I-26 to I-33, III-54 to III-57.
Analog Devices, Inc. "Analog–Digital Conversion Handbook," 1972, pp. II-158 to II-163.
Schmid, "Analog to Digital Converters," 1970, pp. 396-404.

*Primary Examiner*—Thomas J. Sloyan
*Attorney, Agent, or Firm*—C. M. Lorin

[57] ABSTRACT

Low level analog signals from remote locations are amplified after being converted into two consecutive analog signals of opposite polarities and a digital system causes A/D conversion to occur in two successive readings corresponding to said polarities and an algebraic combination of the two successive readings in binary form provides a true reading which is made available for digital processing by a special control circuit.

15 Claims, 4 Drawing Figures

ANALOG SIGNAL PROCESSING SYSTEM WITH CORRECTION FOR AMPLIFIER OFFSET

BACKGROUND OF THE INVENTION

The invention relates in general to analog data processing systems and more particularly to low level analog data acquisition multiplexed subsystem interfaced with a digital subsystem.

Digital computer process control or monitoring requires many input data in analog form which are derived by sensing devices located at various points of the controlled industrial process. These input data are converted into digital form for fast and complex treatment within a digital processing system before output signals can be supplied for control or monitoring action. A digital system includes digital circuitry which controls the opening and closing of relays associated with the analog multiplexing system. As a result of such relay closing and opening actions, input data acquisition is obtained from the multiplexed system through cables providing communication between the interface of the digital system and the various and remote locations where the transducers sense process variable instantaneous conditions. The multiplexed cable system leads to terminals which form the input to an analog digital converter providing the necessary transformation from analog to digital of the analog signals sequentially received each during a time interval of measurement generally of 1/60 of a second duration. Since the sensing devices are remotely located, long cables are necessary for the transmission of the measurement signals. These signals, however, have a small magnitude, so that the cables have to be shielded from parasitic interference to minimize noise, and these shields are connected electrically to form a potential floating system from the point of measurement to the input of the analog digital converter.

Problems arise due to common mode, normal mode potentials, and offset voltages, which potential and voltages may often exceed by several orders the magnitude of the sensed analog signal. These problems are more difficult to cope with when high speed multiplexing is involved. In particular high voltage switches are required to stand off common mode voltages, and offset voltage errors subsist. Attempts have been made in the prior art to solve these problems in general. For instance, it is known to modulate each of the input signals received on a plurality of channels in order to take advantage of transformer coupling and to allow the associated channel to float freely on one side of the transformer according to a generally known technique for rejecting the common mode noise. However, such prior art solutions do not eliminate the errors due to offset voltages and contact potentials. These errors subsist after demodulation in the input signal reading effect at the interface with the digital system.

It is known from U.S. Pat. No. 2,877,308 of Reiner to periodically inverse both the input and the output connections of a direct current integrator having a balanced amplifier in order to eliminate offset errors in the reading of low-level analog signals. However, the Reiner patent does not deal with these problems in the context of a multiplexed analog signal system coupled to a digital system.

It is known, from U.S. Pat. No. 3,656,065 of Reinhard, to transmit a low-level analog imput signal from a floating data acquisition system including a floating input differential amplifier, through an isolation power transformer after modulation by an AC signal and to synchronously demodulate the signal for reconversion as one analog signal to be read. In this arrangement, however, modulation is effected after the input differential amplifier and it does not eliminate potential offset errors.

The object of the present invention is to provide an improved multiplexed analog data acquisition system suitable for low level input signals and capable of being interfaced with a digital system.

Another object of the present invention is to provide an improved analog signal processing system which is compatible with digital processing techniques and which is free from offset voltage errors and contact potentials as generally encountered when dealing with low level input signals derived from remote locations.

SUMMARY OF THE INVENTION

The invention resides in an analog signal processing system comprising a floating analog data acquisition subsystem coupled with a digital subsystem, in which each of a plurality of low-level analog input signals is converted within said data acquisition subsystem into two information bearing analog signals of opposite polarities and in which said digital subsystem includes an analog to digital converter for deriving digital signals from each of said information bearing analog signals and means for combining the derived digital signals so as to obtain said information in digital form and free from any offset voltage error.

One of the main features of the analog signal processing system according to the present invention is the provision of a low-level analog data acquisition subsystem coupled to a modern digital subsystem through a high-speed multiplexer, with measures being taken in part within the data acquisition subsystem and in part within the digital subsystem for eliminating any offset voltage error which could affect the reading of the acquired data. Other important features will appear later from the description given, hereinafter, of the preferred embodiment of the present invention.

For the sake of illustration, the invention will now be described in the context of an industrial process controlled by a digital process control system embodying a digital computer system such as a Prodac 2000 (P2000) sold by Westinghouse Electric Corporation. A descriptive book entitled "Prodac 2000 Computer Systems Reference Manual" has been published in 1970 by Westinghouse Electric Corporation and made available for the purpose of describing in greater detail this computer system and its operation.

The computer processor is associated with well known input systems including conventional contact closure input systems which scans contact or other signals representing the status of various process conditions, an analog input system which scans and converts process analog signals. The invention is more particularly concerned with the analog data acquisition system scanned by the analog input system and the generation of digital data in response thereto which are free from offset voltage errors. The analog input data are provided by a plurality of transmission cables which extend to various sensing devices, such as thermocouples, which are remotely connected and located within the industrial environment of the controlled process. The digital data are specially treated before passing to the digital system proper.

DESCRIPTION OF THE PREFERRED EMBODIMENT

Figure 1:
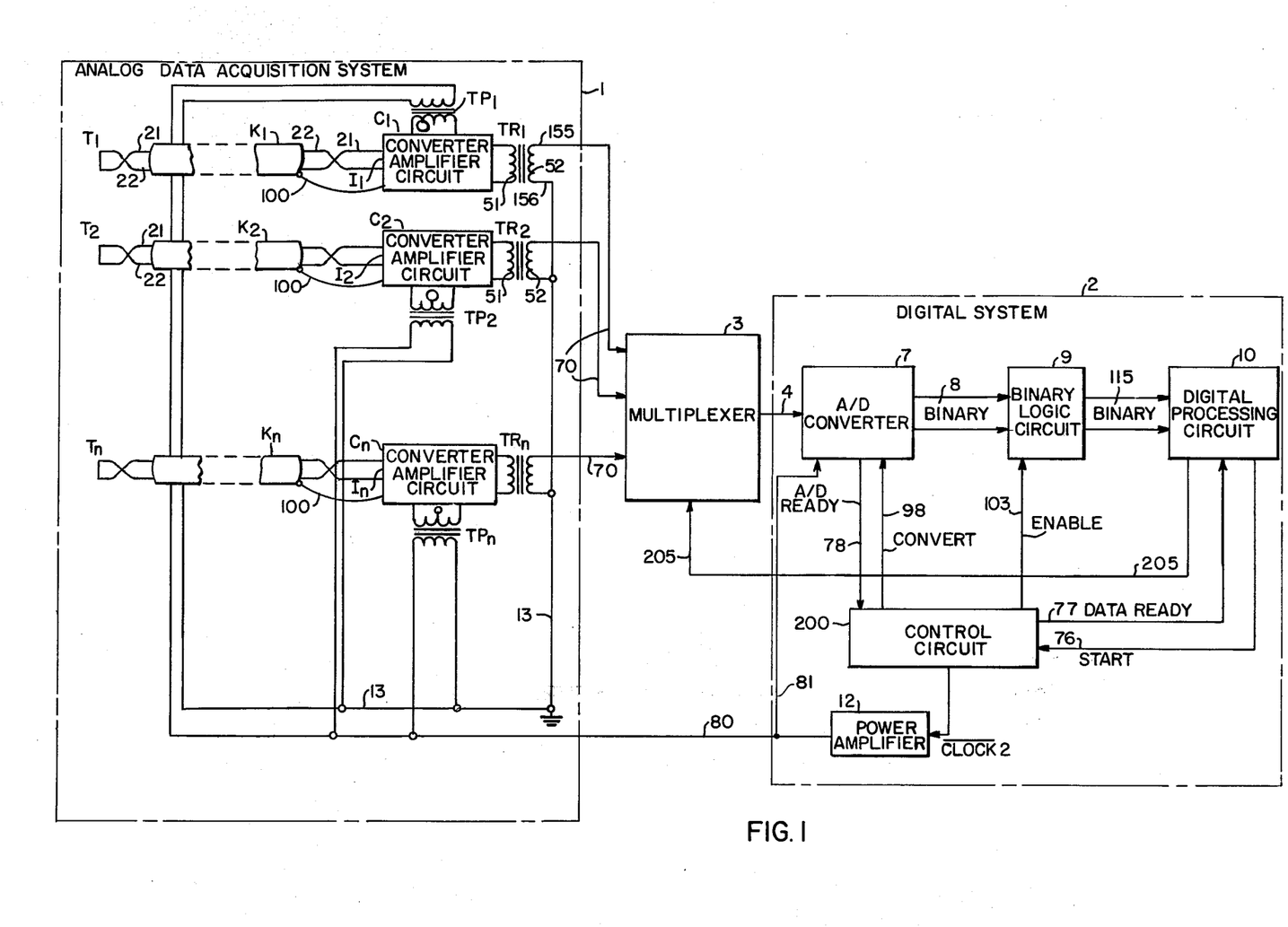
FIG. 1 shows the analog data acquisition system and the digital system which together form the analog signal processing system according to the present invention.

Referring to FIG. 1, a multichannel data acquisition system 1 is shown comprising n transducers such as $T_1$, $T_2 \ldots T_n$ connected by shielded cables $K_1$, $K_2 \ldots K_n$ respectively to inputs $I_1$, $I_2 \ldots I_n$ of respective converter-amplifier circuits $C_1$, $C_2 \ldots C_n$, each having an output connected to the primary winding of an associated isolation transformer, $TR_1$, $TR_2 \ldots$ or, $TR_n$ and supplied with power each individually from the secondary winding 57 of a corresponding isolation transformer $TP_1$, $TP_2 \ldots$ or, $TP_n$.

Between each transducer $T_1$, $T_2 \ldots$ or $T_n$, and the primary of transformer $TR_1$, $TR_2 \ldots$ or $TR_n$, a communication channel is defined by a two-wire cable (21, 22), a bilateral switch device 20 (FIG. 2) responsive to symmetrical inputs 21, 22 of opposite polarities derived from the cable $K_1$, $K_2 \ldots$ or $K_n$, a balanced preamplifier circuit formed of two operational amplifiers 31, 32 connected as a high input impedance adjustable gain differential amplifier (FIG. 2), and a DC source in the form of a full wave rectifier bridge 55 for supplying current to the bilateral switch device 20 and to each operational amplifier 31, 32, the energy being derived from the secondary of the associated isolation transformer $TP_1$, $TP_2 \ldots$ or $TP_n$.

Figure 2:
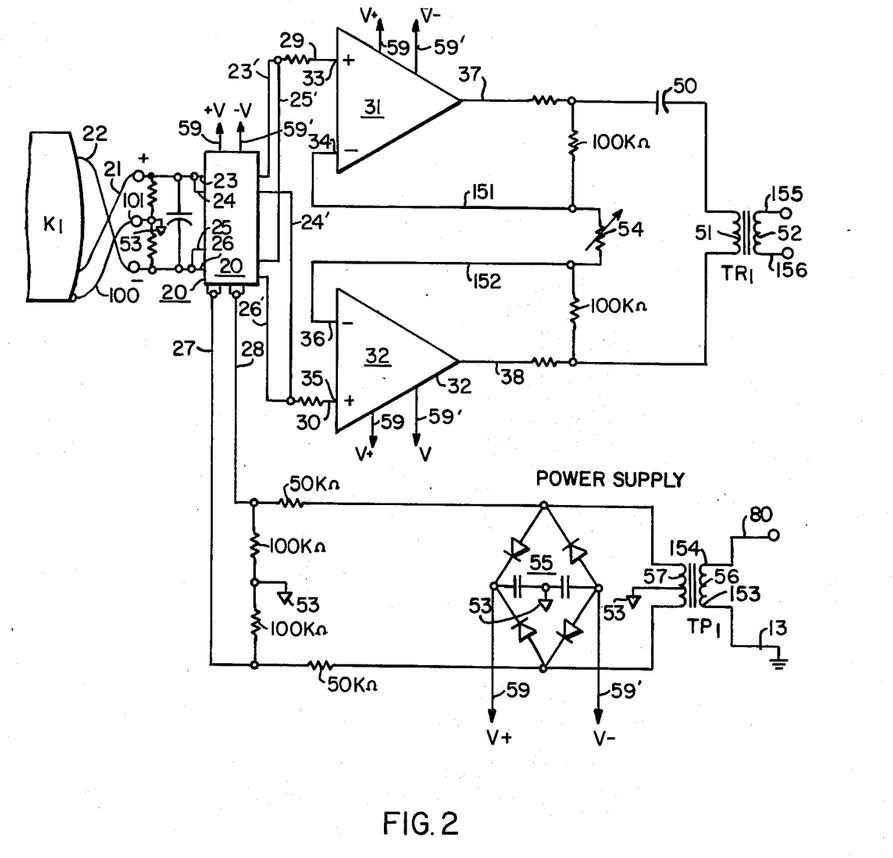
FIG. 2 shows with particularity the converter-amplifier circuit which is part of the analog data acquisition system of FIG. 1.

In each particular channel so defined, the shield of the cable is connected at 100 to a common point 53 which is also connected to the case of the converter-amplifier circuit, to the middle point of the balanced arrangement formed by the two operational amplifiers, to the middle point between the two input lines 21, 22, to the bilateral switch device 20, and also to the center tap of the secondary of the associated transformer $TP_1$, $TP_2 \ldots$ or $TP_n$. Thus each channel is floating with the common mode noise that the transformer coupling at $TR_1$, $TR_2 \ldots TR_n$ and $TP_1$, $TP_2 \ldots TP_n$ tends to isolate from the other portions of the circuitry.

Between the data acquisition system 1 and the digital system 2 of FIG. 1, an analog multiplexer circuit 3 is provided for supplying on a common bus 4 analog data derived in a sequential manner or at random under control of an address instruction from bus 205 issued from a digital processing circuit 10 within the digital system. Such address instructions select channels on a scanning, or random fashion. A card encoder circuit is generally associated with the A/D converter in order to effect a proper selection between the multiplexer cards and the particular circuit package therein for reading the desired channel at any given time.

Bus 4 supplies the derived analog data to an analog to digital converter 7 from which a binary number is obtained along lines 8 which correspond in number to the number of bits treated. Twelve bits are used in the particular instance of the preferred embodiment. Such binary number is stored in a binary logic circuit 9 which treats the binary number in such a way, as explained hereinafter, that the digital information derived at the output on lines 115 is a representation of the true analog reading of the selected transducer $T_1$, $T_2 \ldots$ or $T_n$, which is to be processed by the digital processing circuit 10. A power amplifier 12 is associated with the digital processing circuit, and supply is provided from it on line 80 to the primary windings of transformers $TP_1$, $TP_2 \ldots TP_n$ and on line 81 to the A/D converter 7. The secondary windings of the transformers $TR_1$, $TR_2 \ldots TR_n$ are connected to each of the inputs of multiplexer 3. One extremity of each secondary winding of transformers $TR_1$, $TR_2 \ldots TR_n$ and one extremity of each winding of transformers $TP_1$, $TP_2 \ldots TP_n$ are connected to ground potential, as shown on FIG. 1 at 13. From an overall consideration of the isolation transformers $TR_1$, $TR_2 \ldots TR_n$ and $TP_1$, $TP_2 \ldots TP_n$ and the shielded cables $K_1$, $K_2 \ldots K_n$ and the case of converter amplifier circuits $C_1$, $C_2 \ldots C_n$, it appears that a floating circuitry has been created which does not affect the digital system 2, despite the relatively large common mode noise present at the input of the floating end of the transformers $TR_1 \ldots TR_n$.

The analog data acquisition system and the digital system will now be considered with particularity.

The Analog Data Acquisition System

Referring to FIG. 2, converter-amplifier circuit $C_1$ of the first channel is shown in order to typify one of the circuits $C_1$, $C_2 \ldots C_n$ belonging to the channels of FIG. 1. Circuit $C_1$ is shown with the connections to the associated isolation transformers $TR_1$ and $TP_1$. Both transformers in the preferred embodiment admit signals of ± 15 volts at 2KHz without saturating the core. Transformer $TR_1$ is a low level pulse transformer capacitively coupled at 50 to the output lines 37 and 38 from two operational amplifiers 31 and 32 in order to eliminate core saturation due to any DC bias current from the preamplifiers.

Operational amplifiers 31 and 32 are identical and symmetrically disposed about a floating common potential connection 53 which is connected to the case of the converter-amplifier circuit $C_1$, as well as by 100 to the shield of the two-wire cable $K_1$. The input signal from transducer $T_1$ is transmitted through twisted wires 21, 22 which are connected to the high resistance input of a bilateral switch device 20. Switch device 20 is preferably a COS/MOS Quad Bilateral Switch, Model CD4016A sold by RCA Corporation. This is a solid state commutating switch controlled by two identical squarewave signals of opposite phases which are applied on lines 27, 28, respectively. The device operates as a double-pole, double-throw switch at the squarewave rate. The input signal from transducer $T_1$ appears on lines 21, 22 as a differential signal between two voltages of opposite polarities relative to the floating preamplifier common point 53. The measured potential is thus floating with the common mode noise due to the cable shield. Similarly, the outputs derived on lines 37, 38 from operational amplifiers 31, 32, are floating with the common mode noise in this balanced preamplifier arrangement. The bilateral switch device 20 of FIG. 2 performs the function of a double-pole, double-throw, switch between wires 21, 22 from the associated cable $K_1, K_2 \ldots$ or $K_n$, and the non-inverting inputs 29, 30 of the operational amplifiers 31, 32 in applying thereto in direct and reverse order, alternately, the two polarities of the differential analog signal received from transducer $T_1, T_2 \ldots$ or $T_n$. In the preferred embodiment, device 20 has four inputs, two 23, 24 affected to one polarity and two, 25, 26 affected to the other polarity. Device 20 also has four outputs associated with these same polarities, namely, 23', 24', 25', 26'. Control signals on lines 27, 28 cause switching of the inputs and outputs by pairs two at a time, alternatively, so that the bipolar differential signal on wires 21, 22 appear successively in reverse order between outputs 23', 26' and 24', 25', as shown in FIG. 2, to be impressed on the noninverting inputs 29, 30. The inverting inputs 34, 36 of operational amplifiers 31, 32 are connected to the two ends of a variable resistor 54 via respective lines 151, 152 which are also respectively connected to the output lines 37, 38 by a network of capacitors and resistors adjusted to the characteristics of the associated operational amplifier. Thus, resistor 54 can be used to vary the gain of the balanced preamplifier arrangement. This arrangement is known as a high input impedance adjustable gain differential amplifier, and a description of this circuit can be found on page 207 of a book by Graeme, Tobey and Huelsman entitled Operational Amplifier Design and Applications, published by McGraw-Hill in 1971. The operational amplifiers 31, 32 are preferably of the type sold as the LM 308 by National Semiconductor Corporation. The specific values shown on FIG. 2 for the resistors and capacitors of the network associated in circuit have been selected to match the characteristics of this particular model. A 511 $\Omega$ resistor is connected within the feedback loop for current limiting of the operational amplifier output during transient conditions. In the configuration shown, the closed loop gain is equal to $(200 \text{ K }\Omega/r) + 1$, where $r$ is the gain selection resistor 54.

The generation of the squarewaves controlling the bilateral switch 20 via lines 27, 28 and the provision of the DC power required to operate the bilateral switch 20 and the operational amplifiers 31, 32, come from transformer $TP_1$ and the associated full wave rectifier bridge 55. The primary winding 56 of transformer $TP_1$ is supplied with a 2KHz and ± 15v squarewave, derived from the digital system, and, as depicted in FIG. 1, one end 153 of the primary winding is at ground potential, the other end 154 receiving the squarewave signal. The secondary 57 supplies a ± 7.5v squarewave. The control signals on lines 27, 28 are thus 180° out of phase and, as shown on FIG. 2, they are attenuated each by a 50K and 100K resistor network about the common point 53 before being used as control signals for the bilateral switch 20. A similar configuration applies to all the other channels.

In each channel a full wave bridge rectifier circuit 55 is associated with the secondary winding 57 of the corresponding transformer $TP_1, TP_2 \ldots$ or $TP_n$. This bridge rectifier circuit provides on lines 59, 59' the energy necessary for the bilateral switch device 20 and for each of the operational amplifiers 31, 32 which are part of the converter-amplifier circuits $C_1, C_2 \ldots C_n$.

The secondary of transformer $TP_1$ has a center tap which is connected to the common point 53 providing the floating potential. Since the center point between lines 21, 22 is also connected to common point 53, and so is the junction point between the two networks formed by the 50K and 100K resistors as well as the center point of the rectifier bridge 55, a generally balanced circuitry is provided for each channel which is able to float freely with the common mode.

It also appears from FIG. 2 that in each channel while the end of cable $K_1$ associated with transducer $T_1$ is connected to a changeover switch 20 preceding a balanced preamplifier arrangement, the changeover switch 20 reverses the polarity of the input signal on lines 21, 22 synchronously with the 2KHz squarewave from the secondary of transformers $TP_1, TP_2 \ldots TP_n$ in accordance with the control signals on lines 27, 28. In each channel also, the gain of the preamplifier arrangement can be selected by adjusting the corresponding resistor 54, so that a common full scale output range is obtained. The data acquisition system according to the present invention, is therefore providing a plurality of inputs, on lines 70, to the analog multiplexer 3 (see FIG. 1), which inputs are selected by the digital system, either at random or at a scan rate. The analog multiplexer 3 receives the signals from one end 155 of the respective primary windings 52 of the transformers $TR_1, TR_2 \ldots TR_n$, the other end 156 thereof being at ground potential, by line 13. Thus, single-ended switches operating at high speed can be used in the analog multiplexer. From power amplifier 12 the 2KHz squarewave is supplied via line 80 to one end 154 of each primary winding of transformers $TP_1, TP_2 \ldots TP_n$, the opposite end 153 of each winding as previously mentioned being connected to ground via line 13. As a result of the switching operation by the bilateral switch device 20, in each channel selected via line 205 by the digital processing circuit 10, two successive signals of opposite polarities appear at the secondary of transformer $TR_1, TR_2 \ldots$ or $TR_n$ which are transmitted via lines 70 and 4 to the A/D converter 7. The control circuit 200 synchronizes the operation of the A/D converter 7 with the squarewave voltage supplied on line 80 by the power amplifier 12. Synchronization results from a $\overline{\text{Clock}}$ 2 signal and a Convert signal. It follows that two successive conversions on the respective two signals of opposite polarities read on line 4 are obtained. These two readings are algebraically combined in a binary logic circuit 9 in order to obtain on line 204 a binary reading of the signal sensed by the transducer $T_1, T_2 \ldots$ or $T_n$ which can be processed by the digital processing circuit 10.

The multiplexed analog data acquisition system just described is floating with each individual channel ($K_1, K_2 \ldots K_n$) and the selected floating circuitry includes one side of the two associated transformers such as $TR_1$ and $TP_1$. Each channel has its own power source (55, 59, 59'). Each channel includes a converter-amplifier circuit ($C_1, C_2 \ldots C_n$) which provides preamplification for the analog input signal through a balanced high input impedance adjustable gain differential arrangement which is floating by its own common point 53, thus, it is devoid of any common mode error. Still, any offset error due to the preamplifier arrangement is, according to the present invention, eliminated by splitting the input signal into two signals of opposite polarities before preamplification. Therefore, the offset error which would have been carried by the amplified sensed analog signal is found to the same extent superposed on both of the amplified signals of opposite polarities. A subsequent correction is effected by subtraction of the two corresponding digitally converted signals, thus, after analog-to-digital conversion. Advantage is also taken of the alternating current form of the amplified signal in order to couple this portion of the data acquisition system to the analog multiplexer 7 via isolating transformers, whereby the floating condition on one side thereof within the data acquisition system is independent from the ground-related other side including the digital system which will be considered now with particularity.

The Digital System

Figure 3:
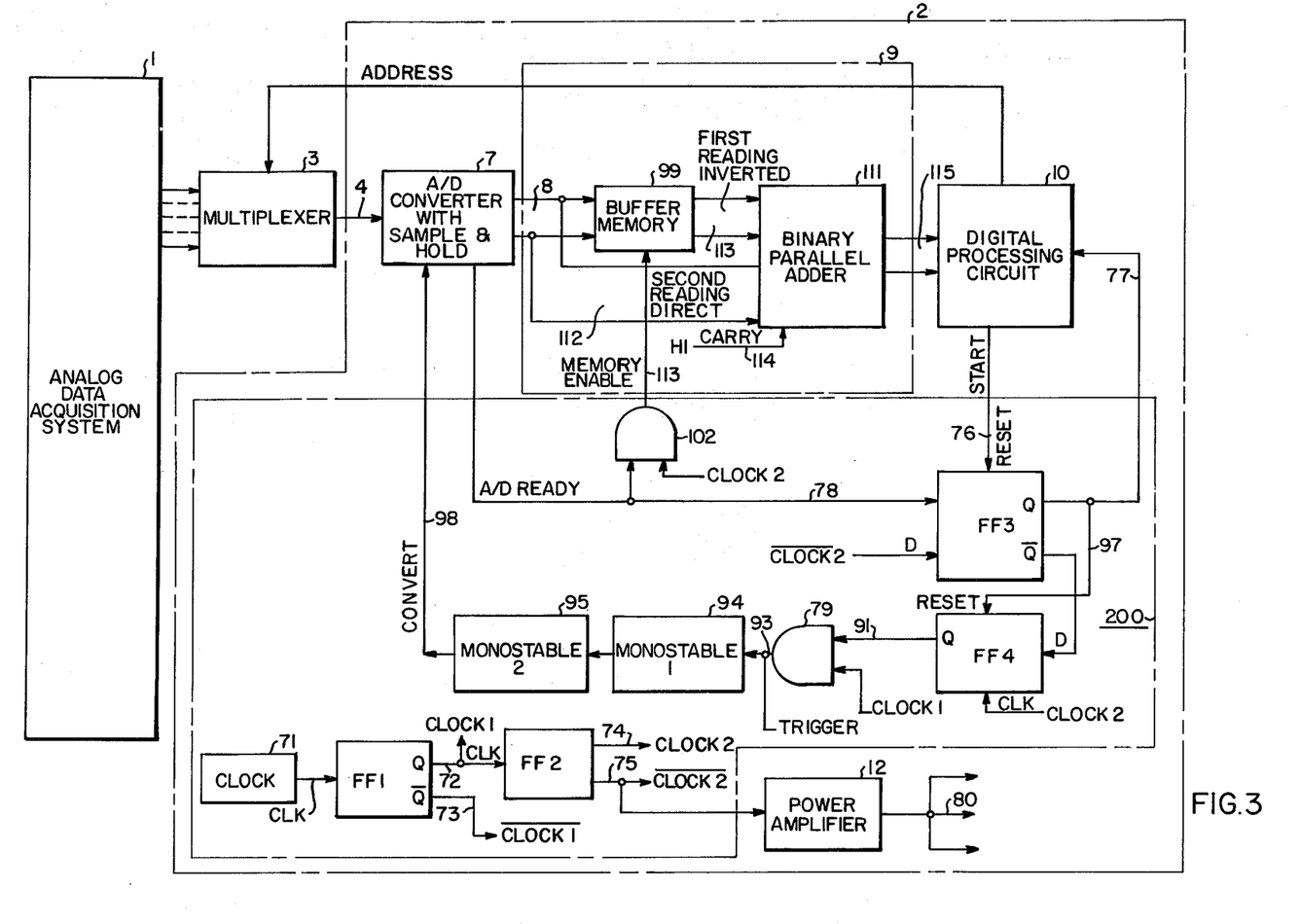
FIG. 3 diagrammatically illustrates the relationship of the control circuit, the A/D converter and the binary logic circuit which are parts of the digital system of FIG. 1.

FIG. 3 represents the digital system portion 2 of the analog signal processing system according to the present invention. It includes an A/D converter 7, a binary logic circuit 9 responsive to the binary output of the A/D converter, a digital processing circuit 10 for processing the output of the binary logic circuit 9, a control circuit 200 for generating pulses to control the operation of the A/D converter and of the binary logic circuit. The control circuit also makes the A/D conversion available upon request by the digital processing circuit, e.g. in response to a signal START is sent via line 76 to the control circuit 200, as will be seen hereinafter.

The control circuit 200 depicted in FIG. 3 includes an 8KHz clock 71 controlling a first flip-flop $FF_1$ dividing the frequency by two to provide at its Q output a signal Clock 1 and at its $\overline{Q}$ output a signal $\overline{Clock}$ 1, on respective lines 72, 73. Signal Clock 1 in turn controls a second flip-flop $FF_2$ also dividing the frequency by two to provide at its $\overline{Q}$ output a signal $\overline{Clock}$ 2, and at its Q output a signal Clock 2, on respective lines 74, 75. Signals Clock 1 and Clock 2 are shown by curves A and B, respectively, in FIG. 4. Flip-flops $FF_1$ and $FF_2$ are preferably of the type known on the open market as a J-K FLIP-FLOP.

Signal $\overline{Clock}$ 2 is applied to the power amplifier 12 to generate on lines 80 the 2KHz squarewave supplied to the primary windings 56 of transformers $TP_1$, $TP_2$ ... $TP_n$.

Signal $\overline{Clock}$ 2 is also impressed at the data input D of a third flip-flop $FF_3$. The third flip-flop is preferably of the D type, generally known on the open market. With such devices a transfer of the D input to the Q output occurs on the positive edge of the signal at the clock input e.g. the A/D READY signal on line 78 from the A/D converter 7. Such flip-flop has three inputs called Reset, Clock and D (for Data), and two outputs called Q and $\overline{Q}$. $FF_3$ provides at its Q output a Data Ready signal which, via line 77, is applied to the digital processing circuit 10. A conversion cycle is started via line 76 by the digital processing circuit 10, which resets $FF_3$. The Start signal is depicted by curve C in FIG. 4. The Data Ready signal appears as curve D. Since the logic circuitry of the A/D converter 7 requires some time to effectively assume the proper state at any given time, it includes as generally known a Sample and Hold circuitry. The signal A/D Ready is provided by the A/D converter on line 78 to indicate that the A/D conversion is completed. The A/D Ready Signal is shown by curve H in FIG. 4.

A fourth flip-flop circuit $FF_4$ of the D type, thus like flip-flop $FF_3$ (e.g. transfer of the D input to the Q output occurs on the positive edge of the clock signal) is also provided. $FF_4$ is controlled by signal Clock 2. It receives as data input D the $\overline{Q}$ output of the third flip-flop $FF_3$ from line 96. It is also reset via line 97 by the Data Ready signal, or Q output, from flip-flop $FF_3$. The transferred data appears on line 91 as an input to an AND device 79 also responsive to signal Clock 1. As a result, a signal Trigger is generated on line 93. The signal Trigger is shown by curve E in FIG. 4. Two cascaded monostable circuits 94, 95 provide in response to the signal Trigger a Convert signal on line 98 which is the signal determining operation of the A/D converter 7 on the analog output from the multiplexer 3. Two conversions are made in each succession, each for one of the two signals of opposite polarites appearing on line 4. Thus, two successive readings in binary appear on the 12-bit output 8. The output signal from monostable circuit 94 is shown by curve F in FIG. 4, and the Convert signal is illustrated by curve G. In coincidence with signal Clock 2 an AND device 102 generates in response to the A/D Ready Signal on line 78 a Memory Enable signal. The latter signal is applied via line 103 to a Buffer Memory circuit 99 which stores the binary number received on lines 8 from the A/D converter during the first reading (first polarity signal from multiplexer 3), and inverts it. During the second reading, the binary number on lines 8 is applied via lines 112 to the input of a binary parallel adder 111 which also responds to the inverted number derived via lines 113 for the first reading. A Carry signal is also applied on line 114 to the binary parallel adder 111. The adder when adding the input on line 113 to the input on line 112 and the carry bit, in fact effects, as generally known, the sum of the second reading and the two's complementary of the first reading, which results in an arithmetic subtraction of the two readings. As a result of such digital subtraction of the two amplified signals of opposite polarities, the offset error appearing equally in each of them cancels out and a true reading of the analog signal sensed in the selected channel is obtained in binary form on lines 115, e.g. a reading free from the offset error due to preamplification which would have been present in the amplified analog signal and would have been carried over by the conversion into digital form effected by the A/D converter. In contrast, the two signals of opposite polarities carry after amplification the same offset error. When the two signals are received sequentially on line 4 the common offset error is eliminated after conversion by the algebraic subtraction made in digital form, in accordance with the present invention.

Figure 4:
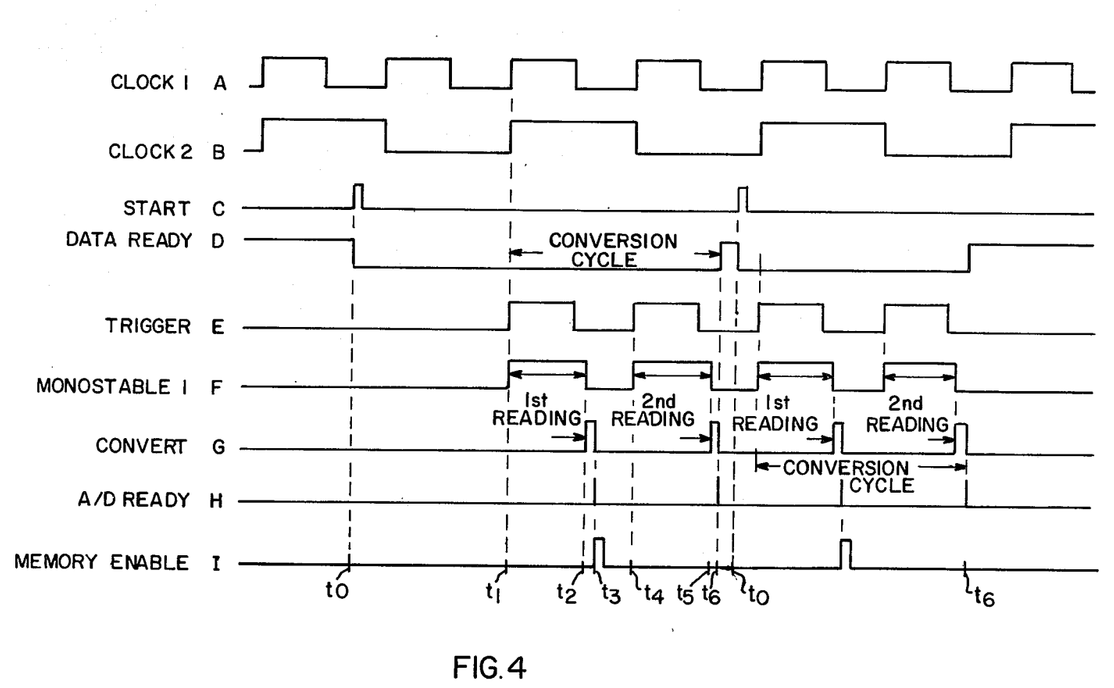
FIG. 4 illustrates by a series of curves the operation of the analog signal processing system according to the present invention.

The timing of the operational steps under control of the control circuit 200 can best be understood from a consideration of the curves of FIG. 4.

The digital processing circuit 10 is so arranged that no Start signal (curve C) will be transmitted unless the Data Ready signal (curve D) on line 77 is high in accordance with the state of $FF_3$ on its output Q. When a START signal is received via line 76, $FF_3$ is reset and as a result the Q output thereof is lowered which appears on line 77. At the same time $\overline{Q}$ is raised on $FF_3$ thereby to set the D input of $FF_4$ in the high state (via line 96), and $FF_4$ is thus conditioned for further operation.

Synchronously with the rising edge of the clock 2 signal, $FF_4$ transfers the D input to the Q output thereof so that via line 91 the AND device 79 will be set in coincidence with the clock 1 signal to generate on line 93 a Trigger signal (curve E). The rising edge of the Trigger signal triggers the first monostable circuit 94 thereby establishing on line 206 a time delay (curve F) for the initiation of the second monostable circuit 95 which actually produces the Convert signal (curve G) to effectively command operation of the A/D converter 7.

Once the first reading is performed by the A/D converter 7, an A/D Ready signal (curve H) is established via line 28 to be received by the AND device 102 in order to generate in coincidence with the Clock 2 signal a Memory Enable signal (curve I) to enable Buffer Memory 99, thus at the end of the first reading, to store the first reading from the A/D converter 7. It is observed that during the occurrence of the second polarity signal on line 4 (thus with the $\overline{\text{Clock 2}}$ signal) the Memory Enable signal (curve I) is not generated, thereby to have only a direct second reading on lines 112 to the Binary Parallel Adder 111. The Trigger signal is again generated when Clock 1 signal rises and operates in conjunction with the Q output of $FF_4$. Again, the first monostable circuit 94 establishes its delay on line 206, and the second monostable circuit at the end of the delay commands via line 98 the second reading by the A/D converter 7 to be derived on line 112.

Now the A/D Ready signal synchronously sets $FF_3$ by transferring the $\overline{\text{Clock 2}}$ signal at its D input to its Q output thereby to generate the Data Ready signal on line 77 and on the rising edge of the A/D Ready signal. The Data Ready signal is intended to inform the digital processing circuit 10 that the two readings have been completed, and that the binary parallel adder has made available the desired true reading. Again, the Data Ready signal on line 97 resets $FF_4$ for a subsequent conversion cycle.

As can be seen by reference to instants $t_0$ and $t_1$ through $t_5$, the monostable circuit 94 establishes two intervals $(t_1, t_2)$ and $(t_4, t_5)$ before initiating at times $t_2$ and $t_5$ the first and second reading operations of the A/D converter 7. The Sample and Hold circuit within the A/D converter responds to the Convert signal to cause effective transmissions on lines 8 and 112 of the two successive readings during the conversion cycle. The Memory Enable signal on line 103 causes latching of the 12 bits on line 8 during the first reading, e.g. at time $t_3$ (curve I) to provide an inverted representation on line 113 of the binary number derived during the first reading. At time $t_5$ (curve I) the second reading starts and data is made available on line 112 concurrently with the binary number of line 113. At time $t_6$, Data Ready and A/D Ready signals (curves D and H) acknowledge completion of the reading and at time $t_0$ another Start signal from the digital processing circuit 10 may follow for a new A/D conversion cycle. The first reading cycle to the left of FIG. 4 showed that while the data processing circuit 10 asks by its signal Start from the control circuit 200 another conversion cycle, this was too early for the A/D converter 7. It is not until the rising edges of Clock 2 signal, that the first monostable circuit 94 (curve F) can start establishing its delay for the second monostable circuit 95 to generate the Convert signal on line 98 thus within the time interval corresponding to duration of the analog signal of one polarity to be read. In contrast, for the next conversion cycle (to the right of FIG. 4) the Start signal occurs at time $t_0$ which is close enough to the rising edge of the Clock 2 signal so that a Trigger signal can occur substantially without waiting. In this fashion the digital processing circuit can take analog data readings which are synchronized with 2KHz rate of polarity reversals by the bilateral switches 20 for each selected channel.

It appears from such time operation that the 2KHz squarewave controlling the conversion of the analog signals from transducers $T_1, T_2 \ldots T_n$ by the associated bilateral switch devices 20, is synchronized with the conversion cycles depicted on FIG. 4, since it is within such conversion cycles that the first and second readings are effected and the binary parallel adder 111 effectively combines the two readings to generate on lines 115 a true representation of the original analog signal initially split into two signals of opposite polarities.

FIG. 3 also shows that the binary logic circuit 9 includes a Buffer Memory 99 (which in fact consists of three QUAD latches responsive to the 12-bit output of the A/D converter, on lines 95) and a binary parallel adder 111 responsive via lines 112 to the 12-bit output of the A/D converter 7 and further responsive to the 12-bit complement output from the Buffer Memory 99 via line 113. The binary parallel adder 111 in this particular instance comprises a cascaded set of three 4-bit parallel adders and a single adder to form a 13-bit parallel adder at the addition of two 12-bit numbers required and is provided on line 114, with the Carry input of the least significant bit adder being a ONE, thereby to form within the binary parallel adder 111 the function of two's complement subtraction between two successive readings by inverting the first reading and adding it with a carry to the second reading non-inverted. As a result the binary logic circuit 9 in fact subtracts the readings successively derived on line 4 from the analog signal acquisition system 1 for a pair of signals of opposite polarities received at the output of the transformer $TR_1$, $TR_2$ or $TR_3$. As hereabove explained, each signal represents the same analog input signal sensed by transducer $T_1$, $T_2$ or $T_3$, however, each having the same undesirable voltage offset. The subtraction effected digitally by the binary logic circuit 9 between two successive digital readings made after the A/D converter 7 cancels out the voltage offset. The binary parallel adder 111 offers a very simple circuit for obtaining such a subtraction. At the output of the binary parallel adder a single 13-bit reading is available, free from the common offset error which has now disappeared through the arithmetic process and the correct reading is inputted into the digital processing circuit 10 for further processing as desired within the overall analog signal processing system according to the present invention.

We claim:
1. An analog signal processing system including an analog data acquisition subsystem for transmitting from remote locations at least one low-level analog signal;
   analog to digital (A/D) converter means responsive to said analog input signal for converting the said signal into a digital input signal, and
   a digital system for processing said digital input signal with said analog signal processing system comprising:
   means within said data acquisition subsystem for converting one low-level analog signal into a pair of time-displaced analog input signals having opposite polarities, with each input signal of said pair carrying information relative to the magnitude of said low-level analog signal;
   amplifier means successively responsive to each input signal of said pair of input signals for generating a corresponding pair of time-displaced amplified signals each having an offset error due to drift in said amplifier means;

analog to digital converter means successively responsive to each amplified signal of said pair of amplified signals for generating a corresponding pair of successive digital output signals;

a digital subsystem including means for algebraically combining said of a pair digital output signals to derive one digital measurement signal characteristic of said magnitude of said one low level analog signal; and means for digitally processing said digital measurement signal in relation to said data acquisition subsystem, in relation to said means for algebraically combining and in relation to said analog to digital converter means, whereby said offset error is substantially eliminated from said digital measurement signal.

2. The processing system of claim 1 with means for synchronizing the operation of said means for converting with the operation of said A/D converter means.

3. The processing system of claim 1 with said analog data acquisition subsystem transmitting in a multiplex fashion a plurality of said low-level sensed analog signals; and including a plurality of said means for converting and a corresponding plurality of said amplifier means, with said plurality of converting means being multiplexed to separately respond to respective ones of said low level analog signals and to derive successive pairs of said input signals of opposite polarities as a function of time;

said plurality of amplifier means generating a corresponding plurality of pairs of amplified signals;

with said analog to digital converter means being responsive to each of said pairs of amplified signals successively, thereby to generate a corresponding succession of pairs of digital output signals; and with said algebraically combining means being operative synchronously with said means for converting to derive a plurality of digital measurement signals as a function of time and in correspondence with said plurality of low-level analog signals.

4. The processing system of claim 3 with analog multiplexer means being provided between each of said means for converting and said analog to digital converter means.

5. The processing system of claim 4 with the provision of isolating transformer means between each of said means for converting and said analog multiplexer means, each said transformer means passing a corresponding pair of signals and separating voltage potentials therebetween.

6. The processing system of claim 5 with said analog data acquisition subsystem having a floating potential determined by a common mode noise.

7. The processing system of claim 6 with said means for converting said each including a changeover switch responsive to one said low-level analog signal.

8. The processing system of claim 7 with the provision of preamplifier means between said changeover switch and said isolating transformer means.

9. The processing system of claim 8 with each said amplifier means including two balanced operational amplifiers operative in the differential mode and having a non-inverting input responsive to a corresponding one of said analog input signals and having an output connection, each said output connection providing a corresponding pair of amplified signals.

10. The processing system of claim 1 with said means for algebraically combining comprising:

inverting means for deriving the inverted value of one of said two digital output signals and a binary adder effecting a subtraction of said two digital output signals by adding the binary value of one digital output signal to the said inverted value of the other digital output signal with a carry.

11. The processing system of claim 10 with means for synchronizing the operation of said means for converting with the operation of said analog to digital converter means, said means for synchronizing including control means for establishing alternate time intervals corresponding to the duration of said analog input signals of opposite polarities and for generating control signals for causing operation of said analog to digital converter means each during a corresponding one of said alternate time intervals.

12. The processing system of claim 11 with said digital subsystem including a digital processor operative with the output of said means for algebraically combining, with said means for algebraically combining including buffer means responsive to one digital output signal of one pair during a first reading, to store a representation thereof and parallel adder means responsive to the other digital output signal of said one pair during a second reading and to the stored representation of said one digital output signal for providing a binary subtraction of said first and second readings.

13. The processing system of claim 12 with said buffer means providing an inverted representation of said first reading and said parallel adder means accomplishing a subtraction by adding said inverted representation to said second reading with a carry.

14. The processing system of claim 11 with said digital subsystem generating a start signal at predetermined time instants, said control means being responsive to one said start signal to generate one such said control signal.

15. The processing system of claim 14 with said control signal being generated a predetermined time interval after initiation of the generation of the first one of said analog input signals of a pair following the occurrence of said start signal.

* * * * *